United States Patent
Xia et al.

(10) Patent No.: US 11,988,723 B2
(45) Date of Patent: May 21, 2024

(54) ALTERNATING-CURRENT DETECTION CIRCUIT

(71) Applicant: Shanghai Natlinear Electronics Co., Ltd., Shanghai (CN)

(72) Inventors: Hu Xia, Shanghai (CN); Chunda Wu, Shanghai (CN); Dongfeng Wang, Shanghai (CN)

(73) Assignee: Shanghai Natlinear Electronics Co., Ltd., Shanghai (CN)

( * ) Notice: Subject to any disclaimer, the term of this patent is extended or adjusted under 35 U.S.C. 154(b) by 0 days.

(21) Appl. No.: 18/021,815

(22) PCT Filed: Aug. 18, 2021

(86) PCT No.: PCT/CN2021/113278
§ 371 (c)(1),
(2) Date: Aug. 29, 2023

(87) PCT Pub. No.: WO2022/037618
PCT Pub. Date: Feb. 24, 2022

(65) Prior Publication Data
US 2024/0085492 A1    Mar. 14, 2024

(30) Foreign Application Priority Data
Aug. 20, 2020    (CN) .......................... 202010840567.5

(51) Int. Cl.
*G01R 31/42* (2006.01)
(52) U.S. Cl.
CPC .................. *G01R 31/42* (2013.01)

(58) Field of Classification Search
CPC ....................................................... G01R 31/42
(Continued)

(56) References Cited

U.S. PATENT DOCUMENTS

| | | | | |
|---|---|---|---|---|
| 2009/0102673 A1* | 4/2009 | Xiong | .................... | G01R 31/42 340/658 |
| 2011/0221467 A1* | 9/2011 | Kuo | ........................ | G01R 31/42 324/764.01 |

(Continued)

FOREIGN PATENT DOCUMENTS

| | | |
|---|---|---|
| CN | 104600963 A | 5/2015 |
| CN | 207866887 U | 9/2018 |

(Continued)

*Primary Examiner* — Raul J Rios Russo
(74) *Attorney, Agent, or Firm* — IPRTOP LLC (57) ABSTRACT

An AC detection circuit, including a live wire input end and a neutral wire input end; a first diode and a second diode being both Zener diodes and with anodes connected to each other; a first resistor and a second resistor; a rectification module connected to the live wire input end and the neutral wire input end; a power supply for supplying power; a current mirror module with a current value at the first output end and a current value at the second output end having a fixed ratio; a unidirectional conduction module, configured to enable unidirectional conduction of the current from the current mirror module to the first diode; and a current comparison module, including an oscillator, a timer, a current comparator and a reference current source, and configured to compare the current value of the second output end of the current mirror module with a reference current value.

10 Claims, 2 Drawing Sheets

(58) Field of Classification Search
USPC .................................................. 324/764.01
See application file for complete search history.

(56) References Cited

U.S. PATENT DOCUMENTS

| | | | |
|---|---|---|---|
| 2012/0293161 A1* | 11/2012 | Zhang | G01R 19/1659 |
| | | | 324/119 |
| 2015/0288223 A1* | 10/2015 | Sato | G01R 17/00 |
| | | | 307/66 |
| 2016/0169981 A1* | 6/2016 | Li | G01R 35/00 |
| | | | 361/42 |
| 2017/0153295 A1* | 6/2017 | Huang | G01R 31/40 |

FOREIGN PATENT DOCUMENTS

| | | | |
|---|---|---|---|
| CN | 108957108 | A | 12/2018 |
| CN | 111707962 | A | 9/2020 |
| TW | 200849790 | A | 12/2008 |
| WO | WO9843100 | A3 | 1/1999 |

* cited by examiner

ALTERNATING-CURRENT DETECTION CIRCUIT

FIELD OF TECHNOLOGY

The present invention relates to the field of integrated circuit design and application, and in particular relates to an AC detection circuit.

BACKGROUND

When power is supplied to an electrical device by using an alternating current (AC) power supply, it is generally necessary to detect a power supply state of the AC power supply, so as to take a corresponding emergency measure in time when the AC power is abnormally cut, so as to avoid a secondary accident. For example, the power supply and the electrical device should be disconnected in time after a power cut, so as to avoid an accident caused by accidental restart of the device when the power supply is restored. After the power cut, when a conventional lighting facility cannot work normally, emergency lighting needs to be enabled. For the above requirements, if the power supply state is detected by using a professional power grid monitoring device, the cost is usually high, which is not conducive to popularization and application of power cut detection.

Generally, an AC detection circuit is driven by using an external power supply such as a battery, and the detection circuit consists of two comparators. When the AC power supply does not supply power and it is still connected to an electrical load, the detection circuit outputs a high-level signal, indicating that the electrical load is not disconnected from a power supply terminal in time after the power cut.

However, in the above detection circuit, the battery is used as the power supply of the detection circuit. When a voltage value of the battery fluctuates the battery level changes, an output signal used for characterizing the power supply state in the detection circuit will also change. This not only affects the accuracy of the detection circuit, but can even lead to a misjudgment of the power supply state.

Figure 1:
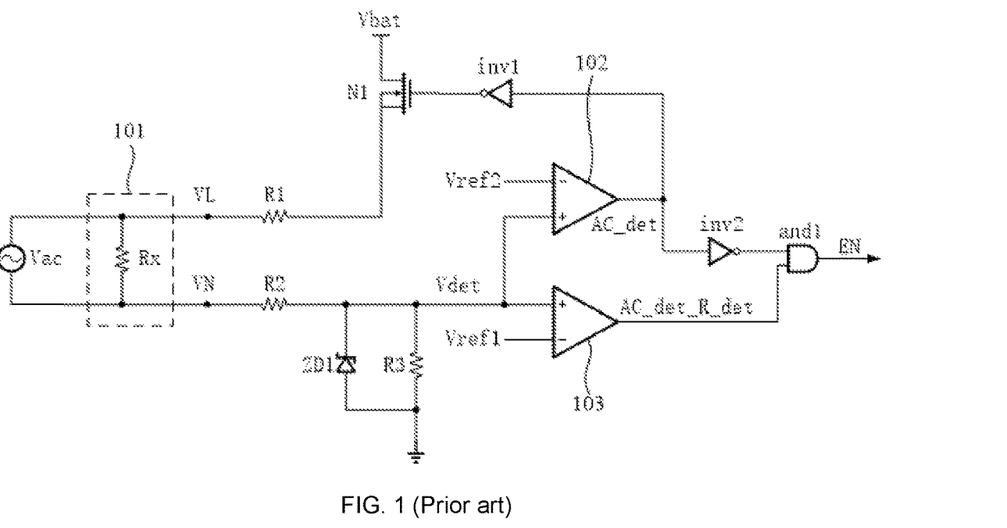
FIG. 1 shows a schematic diagram of an AC detection circuit in the prior art.

FIG. 1 shows an AC detection circuit in the prior art.

In FIG. 1, a neutral wire and a live wire of the AC power supply Vac are connected to a load 101. The load 101 includes loads such as a power grid line and other electrical devices connected to a power grid. Resistance Rx represents the equivalent resistance of the power grid and other loads between the neutral wire and the live wire after the power cut. For example, when an incandescent lamp is connected to the AC power supply Vac through the power grid, and when the AC power supply Vac is powered off, the resistance Rx includes the on resistance of the incandescent lamp and the resistance of the power grid line. An AC detection circuit on the right side is connected to a live wire input end VL and an AC neutral wire input end VN through a first resistor R1 and a second resistor R2. A power supply Vbat may be a battery, which supplies power to the AC detection circuit through an NMOS transistor N1.

The working principle of this AC detection circuit to judge the power supply state of the AC power supply is as follows:

When an input voltage between the live wire input end VL and the AC neutral wire input end VN is 220 V of AC voltage, a clamping diode ZD1 is broken down. At this time, the input voltage Vdet of one input end of a first comparator 102 is equal to the clamping voltage of the clamping diode ZD1, and the clamping voltage is greater than a reference voltage Vref2. The output signal AC_det of the first comparator 102 is a high level, then a NOT gate inv2 outputs a low level, and a signal EN outputted by an AND gate and1 is a low level.

When there is no AC voltage between the live wire input end VL and the AC neutral wire input end VN, and the resistance value Rx of the load 101 is infinite, one input end of the first comparator 102 is dropped down to a zero level by a third resistor R3, and the output signal AC_det of the first comparator 102 and an output signal AC_det_R_det of a second comparator 103 are both a low level, then the signal EN outputted by the AND gate and1 is a low level.

When there is no AC voltage between the live wire input end VL and the AC neutral wire input end VN, and the resistance value Rx of the load 101 is less than a certain value, the voltage value of Vdet is lower than Vref2 and higher than Vref1, the output signal AC_det of the first comparator 102 is a low level, and the output signal AC_det_R_det of the second comparator is a high level, then the signal EN2 outputted by the AND gate and1 is a high level. At this time, the voltage value of Vdet meets:

$$Vref1 < Vdet < Vref2$$

And Vdet can be calculated by the following formula:

$$Vdet = \frac{Vbat * R3}{R1 + Rx + R2 + R3}$$

It can be further deduced from the above that when the signal EN outputted by the AND gate and1 is high level, the resistance value Rx of the load 101 needs to meet:

$$\frac{Vbat * R3}{Vref2} - R1 - R2 - R3 < Rx < \frac{Vbat * R3}{Vref1} - R1 - R2 - R3$$

It can be seen from the above formula that a judgment threshold of Rx is influenced by Vbat, that is, a power supply voltage value. However, during the use of the AC detection circuit, the power supply voltage of the battery and other power supplies is not kept constant, but will change as the battery level changes. This leads to that the judgment threshold of a load resistor Rx in the above formula also changes with the fluctuation of Vbat. When the resistance value of Rx does not change, the signal EN outputted by the AND gate and1 may fluctuate with the change of Vbat. This not only affects the detection accuracy of the detection circuit, but also may lead to the misjudgment of the power supply state. Furthermore, when circuit design is performed based on a detection circuit structure, it is necessary to consider meeting the judgment threshold of the load resistor Rx in the above formula. The selection and calculation of the first resistor R1, the second resistor R2 and the third resistor R3 are relatively complex, resulting in more effort required by the technicians when designing the circuit.

Therefore, it is necessary to propose a novel AC detection circuit.

SUMMARY

The present invention provides an AC detection circuit, which is configured to detect a power supply state of an AC power supply for a load. The AC detection circuit includes:

a live wire input end and a neutral wire input end;

a first diode and a second diode with anodes connected to each other, the first diode and the second diode being both Zener diodes, and a cathode of the second diode being grounded;

a first resistor, having a first end connected to the live wire input end, and a second end connected to a cathode of the first diode;

a second resistor, having a first one connected to the neutral wire input end, and a second end connected to the cathode of the second diode;

a rectification module, connected to the live wire input end and the neutral wire input end;

a power supply, configured to supply power to the AC detection circuit;

a current mirror module, provided with an input end, a first output end and a second output end, the input end of the current mirror module being connected to the power supply, and the value of the current outputted from the first output end of the current mirror module and the value of the current outputted from the second output end of the current mirror module having a fixed ratio;

a unidirectional conduction module, configured to enable unidirectional conduction of the current from the first output end of the current mirror module to the cathode of the first diode; and a current comparison module, configured to compare the current value of the second output end of the current mirror module with a reference current value and output a comparison result; the current comparison module includes: an oscillator, a timer, a current comparator and a reference current source; the oscillator is configured to generate a periodic oscillation signal as a clock signal of the timer; the current comparator is provided with a first input end, a second input end and an output end, the first input end of the current comparator is connected to the second output end of the current mirror module, the second input end of the current comparator is connected to the reference current source, and the output end of the current comparator is connected to the timer; the current comparator compares the current value of the second output end of the current mirror module with the reference current value of the reference current source, and outputs a comparison result signal; and the timer is set with a timer value, and the comparison result signal is outputted after the comparison result signal maintains for the time of the timer value.

Optionally, the unidirectional conduction module includes an NMOS transistor and an amplifier.

The NMOS transistor has a drain connected to the first output end of the current mirror module, and a source connected to the cathode of the first diode.

The amplifier is provided with a first input end, a second input end and an output end. The first input end of the amplifier is connected to a reference voltage source, the second input end of the amplifier is connected to the source of the NMOS transistor, and the output end of the amplifier is connected to a gate of the NMOS transistor.

Optionally, the current mirror module includes: a first PMOS transistor and a second PMOS transistor with gates connected to each other. Sources of the first PMOS transistor and the second PMOS transistor are connected to the power supply, a drain of the first PMOS transistor is connected to the first output end of the current mirror module and a gate of the first PMOS transistor, and a drain of the second PMOS transistor is connected to the second output end of the current mirror module.

Optionally, the ratio of the channel width-to-length ratio of the first PMOS transistor to the channel width-to-length ratio of the second PMOS transistor is 1:m.

Optionally, when there is no AC voltage between the live wire input end and the neutral wire input end, and the impedance Rx of the load meets the following conditions, the timer outputs a high-level signal:

$$Rx < \frac{M \times Vref}{Iref} - R1 - R2$$

In the above formula, M is a ratio of the output current of the second output end of the current mirror module to the output current of the first output end of the current mirror module, Vref is a voltage value of the reference voltage source, Iref is a current value of the reference current source, R1 is a resistance value of the first resistor, and R2 is a resistance value of the second resistor.

Optionally, reverse breakdown voltages and forward conduction voltages of the first diode and the second diode meet the following conditions:

$$V_Z + V_D > Vref$$

In the above formula, $V_z$ is the reverse breakdown voltages of the first diode and the second diode, $V_D$ is the forward conduction voltages of the first diode and the second diode, and Vref is the voltage value of the reference voltage source.

Optionally, the rectification module includes:
a third diode, having a cathode connected to the live wire input end, and an anode grounded; and
a fourth diode, having a cathode connected to the neutral wire input end, and an anode grounded.

Optionally, the reverse breakdown voltages of the third diode and the fourth diode are higher than a peak voltage of the AC power supply.

Optionally, the rectification module includes a bridge rectifier device and a second load. The bridge rectifier device includes: a fifth diode, a sixth diode, a seventh diode and an eighth diode. A first end of the second load is connected to anodes of the fifth diode and the sixth diode, and a second end of the second load is connected to cathodes of the seventh diode and the eighth diode. A cathode of the fifth diode is connected to an anode of the seventh diode and the live wire input end. A cathode of the sixth diode is connected to an anode of the eighth diode and the neutral wire input end.

As described above, the present invention provides an AC detection circuit, which has the following beneficial effects:

According to the present invention, the power supply state of the AC power supply can be judged by detecting the resistance value between the neutral wire and live wire of the AC power supply. When there is no AC voltage between the neutral wire and the live wire of the AC power supply and the resistance value is less than a set value, the high level is outputted, otherwise the low level is outputted. A detection threshold of the resistance value used for judging the power supply state is not affected by the fluctuation of the power supply for the detection circuit, will not change with an application environment, and has high reliability. The circuit has a simple structure, and is convenient to design and debug.

BRIEF DESCRIPTION OF THE DRAWINGS

Reference numerals: 101—load; 102—first comparator; 103—second comparator; 201—load; 202—amplifier; 203—oscillator; 204—timer; 205—current comparator; 206—bridge rectifier device; and 207—second load.

DETAILED DESCRIPTION OF THE PREFERRED EMBODIMENTS

The implementation of the present invention is illustrated with specific examples below. Those skilled in the art can easily understand other advantages and effects of the present invention from the contents disclosed in the specification. The present invention can also be implemented or applied in additional other specific implementations. Various modifications and changes can also be made to the details in the specification based on different views and applications, without departing from the spirit of the present invention.

Figure 2:
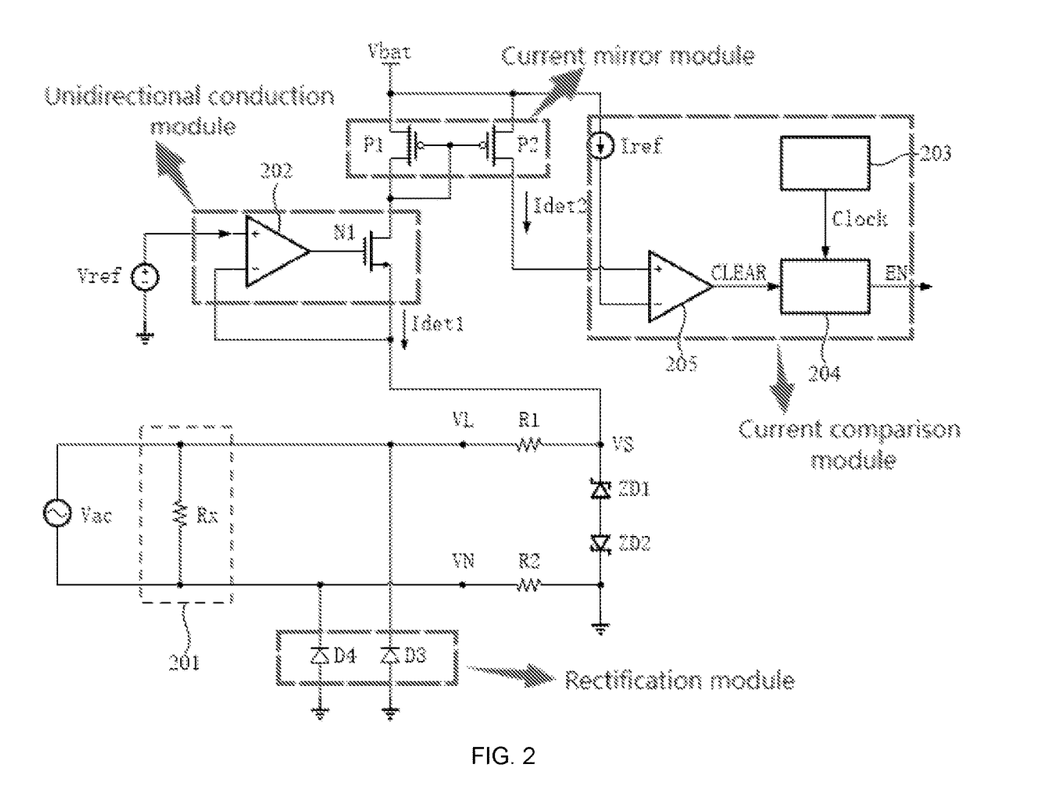
FIG. 2 shows a schematic diagram of an AC detection circuit provided in Embodiment I of the present invention.
Figure 3:
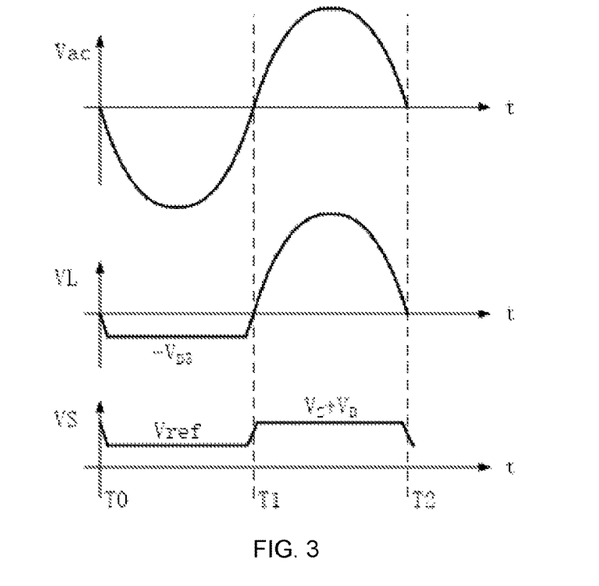
FIG. 3 shows a relational diagram of an AC signal as a function of time provided in Embodiment I of the present invention.
Figure 4:
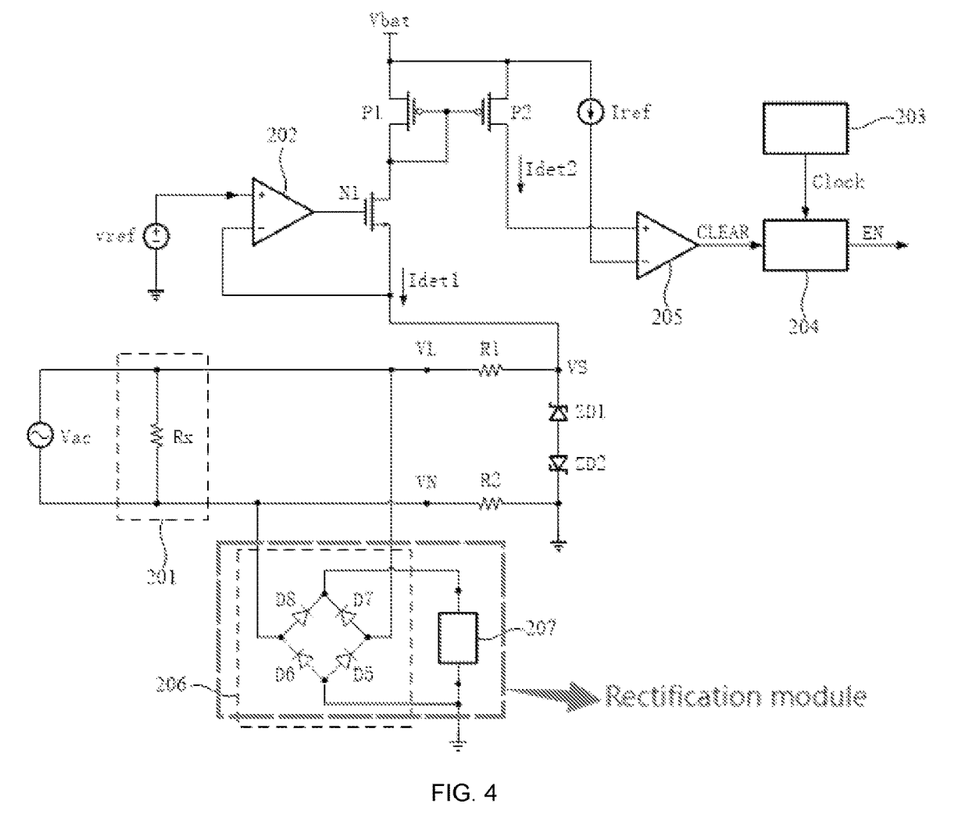
FIG. 4 shows a schematic diagram of an AC detection circuit provided in Embodiment II of the present invention.

Referring to FIG. 2 to FIG. 4, it should be noted that the illustrations provided in this embodiment only illustrate the basic concept of the present invention in a schematic way. Although the illustrations only show the components related to the present invention and are not drawn according to the number, shape and size of the components in the actual implementation, the shape, quantity and proportion of each component in the actual implementation may be a random change, and its component layout may also be more complex.

Embodiment I

FIG. 2 is a schematic diagram of an AC detection circuit provided in this embodiment. The AC detection circuit is configured to detect a power supply state of an AC power supply Vac for a load 201. The AC detection circuit includes:
- a live wire input end VL and a neutral wire input end VN;
- a first diode ZD1 and a second diode ZD2 with anodes connected to each other, the first diode ZD1 and the second diode ZD2 being both Zener diodes, and a cathode of the second diode ZD2 being grounded;
- a first resistor R1, having a first end connected to the live wire input end VL, and a second end connected to a cathode of the first diode ZD1;
- a second resistor R2, having a first end connected to the neutral wire input end VN, and a second end connected to the cathode of the second diode ZD2;
- a rectification module, connected to the live wire input end VL and the neutral wire input end VN;
- a power supply Vbat, configured to supply power to the AC detection circuit;
- a current mirror module, having an input end, a first output end and a second output end, the input end of the current mirror module being connected to the power supply Vbat, and the value of the current outputted from the first output end of the current mirror module and the value of the current outputted from the second output end of the current mirror module having a fixed ratio;
- a unidirectional conduction module, configured to enable unidirectional conduction of the current from the first output end of the current mirror module to the cathode of the first diode ZD1; and
- a current comparison module, configured to compare the current value of the second output end of the current mirror module with a reference current value and output a comparison result. The current comparison module includes: an oscillator 203, a timer 204, a current comparator 205 and a reference current source Iref; the oscillator 203 is configured to generate a periodic oscillation signal as a clock signal of the timer 204; the current comparator 205 is provided with a first input end, a second input end and an output end, the first input end of the current comparator 205 is connected to the second output end of the current mirror module, the second input end of the current comparator 205 is connected to the reference current source Iref, and the output end of the current comparator 205 is connected to the timer 204; the current comparator 205 compares the current value of the second output end of the current mirror module with the reference current value of the reference current source Iref, and outputs a comparison result signal; and the timer 204 is set with a timer value Tcount, and the comparison result signal is outputted after the comparison result signal maintains for the time of the timer value Tcount.

Specifically, in this embodiment, the circuit structure of the AC detection circuit and the specific composition and connection relationship of each module are shown in FIG. 2.

As an example, as shown in FIG. 2, the unidirectional conduction module includes:
- an NMOS transistor N1, having a drain connected to the first output end of the current mirror module, and a source connected to the cathode of the first diode ZD1; and
- an amplifier 202, having a first input end, a second input end and an output end, the first input end of the amplifier 202 being connected to a reference voltage source Vref, the second input end of the amplifier 202 being connected to a source of the NMOS transistor N1, and the output end of the amplifier 202 being connected to a gate of the NMOS transistor N1.

As an example, as shown in FIG. 2, the current mirror module includes: a first PMOS transistor P1 and a second PMOS transistor P2 with gates connected to each other. Sources of the first PMOS transistor P1 and the second PMOS transistor P2 are connected to the power supply Vbat. A drain of the first PMOS transistor P1 is connected to the first output end of the current mirror module and the gate of the first PMOS transistor P1, and a drain of the second PMOS transistor P2 is connected to the second output end of the current mirror module. The ratio of the channel width-to-length ratio of the first PMOS transistor P1 to the channel width-to-length ratio of the second PMOS transistor P2 is 1:m.

As an example, as shown in FIG. 2, the rectification module includes:
- a third diode D3, a cathode of which being connected to the live wire input end VL, and an anode of which being grounded; and
- a fourth diode D4, a cathode of which being connected to the neutral wire input end VN, and an anode of which being grounded;

The working principle of the AC detection circuit in this embodiment is as follows:

The AC detection circuit provided in this embodiment is connected to the neutral wire and the live wire of the AC power supply. The resistance of the load connected to the AC power supply is detected to judge the power supply state of the AC power supply and whether the load is disconnected from the power supply circuit under a power-off state.

As shown in FIG. 2, a neutral wire and a live wire of the AC power supply Vac are connected to a load 201. The load 201 in this embodiment includes loads such as a power grid line and other electrical devices connected to a power grid. Resistance Rx represents the equivalent resistance of the power grid and other loads between the neutral wire and the live wire after the power cut. The AC detection circuit is connected to the live wire input end VL and the AC neutral wire input end VN through the first resistor R1 and the second resistor R2 respectively.

In FIG. 2, the first input end of the amplifier 202 is connected to the reference voltage source Vref, the second input end of the amplifier 202 is connected to the source of the NMOS transistor N1, and the output end of the amplifier 202 is connected to the gate of the NMOS transistor N1. Through the above connection relationship, the amplifier 202 and the NMOS transistor N1 are connected to form a negative feedback structure. When other signals pull down the source of the NMOS transistor N1, the NMOS transistor N1 is conducted, and the current flowing from the source of the NMOS transistor N1 changes with a pull-down signal, so that the voltage value of the source of the NMOS transistor N1 is maintained at Vref. When other signals pull up the source of the NMOS transistor N1, the voltage of the gate of the NMOS transistor N1 decreases, so that the NMOS transistor N1 is turned off. At this time, no current will flow through the source and the drain of the NMOS transistor N1. That is, the unidirectional conduction module can make the current only flow unidirectionally from the top down in an arrow direction of Idet1 in the figure by introducing the amplifier 202 and the NMOS transistor N1 connected in a negative feedback manner.

As shown in FIG. 2, the first diode ZD1 and the second diode ZD2 are both Zener diodes, which are connected back to back, that is, their respective anodes are connected to each other. The reverse breakdown voltage of the first diode ZD1 and the reverse breakdown voltage of the second diode ZD2 are $V_z$, and the forward conduction voltage of the first diode ZD1 and the forward conduction voltage of the second diode ZD2 are $V_D$, which meets $V_z+V_D>$Vref. Since the source voltage value of the NMOS transistor N1 when conducting is Vref, the current flowing from the source of the NMOS transistor N1 and flowing through the first diode ZD1 and the second diode ZD2 is zero. The above connection structure of the first diode ZD1 and the second diode ZD2 can also prevent the current from flowing from a ground wire to the source of the NMOS transistor N1.

As shown in FIG. 2, the anode of the third diode D3 is connected to the ground wire, and the cathode of the third diode D3 is connected to the live wire input end VL. The anode of the fourth diode D4 is connected to the ground wire, and the cathode of the fourth diode D4 is connected to the neutral wire input end VN. In this embodiment, the reverse breakdown voltage of the third diode D3 and the reverse breakdown voltage of the fourth diode D4 are both set to be higher than the peak voltage of the AC power supply Vac to prevent the diodes from being damaged by breakdown.

As shown in FIG. 2, in the current mirror module, the current flowing through the drain of the PMOS transistor P1 is equal to the current flowing through the source of the NMOS transistor N1, and the value of this current is Idet1. The current value of the current flowing through the drain of the PMOS transistor P2 is Idet2. The PMOS transistor P1 and the PMOS transistor P2 are connected to form a current mirror structure. The width-to-length ratio of the PMOS transistor P1 to the PMOS transistor P2 is 1:m, which is determined by physical dimensions of the two devices, so that the ratio of the drain current flowing through the PMOS transistor P1 to the drain current flowing through the PMOS transistor P2 is:

$$\frac{Idet1}{Idet2} = \frac{1}{M}.$$

Under ideal conditions, it can be considered that m=M, that is, the ratio of the drain current of the PMOS transistor P1 to the drain current of the PMOS transistor P2 is equal to the ratio of the width-to-length ratio of the first PMOS transistor P1 to the width-to-length ratio of the second PMOS transistor P2. The ratio of the drain current of the PMOS transistor P1 to the drain current of the PMOS transistor P2 can be adjusted by adjusting the ratio between the width-to-length ratios of the two PMOS transistors P1 and P2.

As shown in FIG. 2, in the current comparison module, the first input end of the current comparator 205 is connected to the drain of the PMOS transistor P2, and its input signal is the current Idet2 flowing through the drain of the PMOS transistor P2. The second input end of the current comparator 205 is connected to the reference current source Iref. When Idet2>Iref, an output signal CLEAR of the current comparator 205 is a high level, while when Idet2<Iref, the output signal CLEAR of the current comparator 205 is a low level.

The output signal CLEAR of the current comparator 205 is used as a clear signal of the timer 204. When the output signal CLEAR is low level, the timer 204 is cleared, and an output signal EN of the timer 204 is immediately reset as the low level. After the output signal CLEAR changes from the low level to the high level, the timer 204 starts counting time. After counting for a time of the timer value Tcount, the output signal EN of the timer 204 will change from the low level to the high level.

Based on the above circuit structure settings, detection conditions of the AC detection circuit of this embodiment for different AC power supply states are listed as follows:

When there is no AC voltage between the live wire input end VL and the neutral wire input end VN, and the resistance Rx of the load 201 between the live wire input end VL and the neutral wire input end VN is infinite, the current flowing from the source of the NMOS transistor N1 and flowing through the first resistor R1 and the second resistor R2 is zero. Since the source voltage value of the NMOS transistor N1 when conducting is Vref, and the voltage values when the first diode ZD1 and the second diode ZD2 are on meet $V_z+V_D>$Vref, the current flowing from the source of the NMOS transistor N1 and flowing through the first diode ZD1 and the second diode ZD2 is zero. At this time, the total current flowing from the source of the NMOS transistor N1 is zero. The current flowing through the drain of the PMOS transistor P1 is equal to the current flowing through the source of the NMOS transistor N1, i.e., Idet1=0, then the current flowing through the drain of the PMOS transistor P2 is Idet2=Idet1=0<Iref, the output signal CLEAR of the current comparator 205 is the low level, the timer 204 is cleared, and the output signal EN of the timer 204 is the low level.

When there is no AC voltage between the live wire input end VL and the neutral wire input end VN, and the resistance Rx of the load 201 between the live wire input end VL and the neutral wire input end VN is less than a certain value, the voltage value of the source of the NMOS transistor N1 is Vref, the current flowing through the first diode ZD1 and the second diode ZD2 is zero, and the current Idet1 flowing from the source of the NMOS transistor N1 and flowing through the first resistor R1, a load resistor Rx and the second resistor R2 can be calculated by the following formula:

$$Idet1 = \frac{Vref}{R1 + Rx + R2}$$

However, since the ratio of the two currents flowing from the current mirror module is fixed at 1:M, the current flowing through the drain of the PMOS transistor P2 meets the following formula:

$$Idet2 = M \times Idet1 = \frac{M \times Vref}{R1 + Rx + R2}$$

When Idet2>Iref is met, the output signal CLEAR of the current comparator 205 is the high level, and the timer 204 start counting time, and after counting for the time of the timer value Tcount, the output signal EN of the timer 204 will change from the low level to the high level. The resistance Rx of the load 201 can be deduced from the above formula, which needs to meet the following requirements at this time:

$$Rx < \frac{M \times Vref}{Iref} - R1 - R2$$

The right side of the above inequality is the detection threshold of the resistance Rx, which is denoted as Rth, that is, when the resistance Rx of the load 201 is less than Rth, and after the time of the timer value Tcount of the timer 204, the output signal EN of the timer 204 will be converted to the high level.

When the input voltage between the live wire input end VL and the AC neutral wire input end VN is AC, the input voltage is a periodic sine voltage:

$$V_{LN} = Vac \times \sqrt{2} \times \sin(wt)$$

As shown in FIG. 3, when the AC Vac is in a negative half cycle, the voltage $V_L$ of the live wire input end VL is lower than the voltage $V_N$ of the neutral wire input end VN, the third diode D3 is in forward conduction, and the voltage value of the live wire input end VL is $V_L=-V_{D3}$, where $V_{D3}$ is a voltage difference between the anode and the cathode of the third diode when the third diode D3 is in the forward conduction. At this time, the first diode ZD1 and the second diode ZD2 are not conducted, and the voltage of the source of the NMOS transistor N1 is Vref. The current flowing through the source of the NMOS transistor N1 is equal to the current flowing through the first resistor R1, and this current value is:

$$Idet1 = \frac{Vref + V_{D3}}{R1}$$

The current flowing through the drain of the PMOS transistor P2 meets the following formula:

$$Idet2 = M \times Idet1 = \frac{M \times (Vref + V_{D3})}{R1} > Iref$$

The output signal CLEAR of the current comparator 205 is changed from the low level to the high level, and the timer 204 starts counting time.

As shown in FIG. 3, when the AC Vac is in the positive half cycle, and when the voltage $V_L$ of the live wire input end VL is higher than the voltage $V_N$ of the neutral wire input end VN, the diode D4 is in forward conduction, and the voltage value of the neutral wire input end VN is $V_N=-V_{D4}$, where $V_{D4}$ is a voltage difference between the anode and the cathode of the fourth diode when the fourth diode D4 is in the forward conduction. The input of the live wire input end VL is a positive voltage, and its voltage value is: $V_L = Vac \times \sqrt{2} \times \sin(wt) - V_{D4}$. The first diode ZD1 is broken down, and the second diode ZD2 is in the forward conduction. At this time, the voltage value of the source VS of the NMOS transistor N1 is $V_Z+V_D$. Since the reverse breakdown voltage and the forward conduction voltage of the first diode ZD1 and the reverse breakdown voltage and the forward conduction voltage of the second diode ZD2 have been set as $V_Z+V_D>$Vref in this embodiment, the voltage at the gate of the NMOS transistor N1 is dropped down, the NMOS transistor N1 is turned off, and the total current flowing from the source of the NMOS transistor N1 is zero. Therefore, the current flowing through the drain of the PMOS transistor P2 is Idet1=Idet2=0<Iref, the output signal of the current comparator 205 is the low level, and the timer 204 is cleared, that is, when the AC Vac is in the positive half cycle, the timer 204 is cleared.

It can be seen from the above that when the input voltage is AC, the timer 204 counts time when the AC is in the negative half cycle and is cleared when the AC is in the positive half cycle. While when the timer 204 starts counting time, the output signal EN of the timer 204 will change from the low level to the high level only after the time of the timer value Tcount. Therefore, when the time of the set timer value Tcount is greater than ½ of an AC cycle, the timer 204 will be cleared before counting time for the time of the timer value Tcount, and the output signal EN of the timer 204 will remain at the low level. Since the frequency of a current civil AC level is usually 50 Hz and 60 Hz, and their corresponding cycles are 20 ms and 16.7 ms respectively, the timer values can be set as Tcount>10 ms correspondingly.

It can be seen from the above analysis that in the AC detection circuit provided by this embodiment, the output signal EN of the timer 204 will become the high level only when there is no AC voltage between the live wire input end VL and the neutral wire input end VN, and the impedance Rx between the live wire input end VL and the neutral wire input end VN meets:

$$Rx < \frac{M \times Vref}{Iref} - R1 - R2.$$

While in the other two cases, the output signal EN of the timer 204 will remain at the low level.

To sum up, the AC detection circuit provided by this embodiment has the advantages of being simple in circuit structure and easy to implement. As for the detection threshold Rth of the load resistor Rx, it meets:

$$Rth = \frac{M \times Vref}{Iref} - R1 - R2.$$

It can be seen from that values of M, Vref, Iref, R1 and R2 in the formula have been determined at the time of circuit design, and will not change with the environment during actual use, so the values have higher stability. In addition, compared with the technical solutionusing three resistors in the prior art, the technical solution used in this embodiment only uses a first resistor R1 and a second resistor R. Therefore, one resistor is omitted. In addition, the impedance Rx between the live wire input end VL and the neutral wire input end VN only needs to meet an upper limit threshold, which also facilitates selection of resistance value for technicians in the circuit design, and facilitates the design and debugging of the detection circuit.

Embodiment II

FIG. 4 is a schematic diagram of an AC detection circuit provided in this embodiment. As an alternative solution of Embodiment I, the AC detection circuit of Embodiment II differs from Embodiment I in that the rectification module includes a bridge rectifier device 206 and a second load 207. The bridge rectifier device 206 includes: a fifth diode D5, a sixth diode D6, a seventh diode D7 and an eighth diode D8. One end of the second load 207 is connected to the anodes of the fifth diode D5 and the sixth diode D6, and the other end of the second load 207 is connected to the cathodes of the seventh diode D7 and the eighth diode D8. The cathode of the fifth diode D5 is connected to the anode of the seventh diode D7 and the live wire input end VL. The cathode of the sixth diode D6 is connected to the anode of the eighth diode D8 and the neutral wire input end VN.

In this embodiment, when connected between the live wire input end VL and the neutral wire input end VN, the bridge rectifier device 206 can play a same role as the third diode D3 and the fourth diode D4 in Embodiment I. Other technical solutions and effects of this embodiment are the same as those of Embodiment I, which will not be repeated here.

To sum up, the present invention provides an AC detection circuit, including: a live wire input end and a neutral wire input end; a first diode and a second diode with anodes connected to each other, the first diode and the second diode being both Zener diodes, and a cathode of the second diode being grounded; a first resistor, one end of which being connected to the live wire input end, and the other end of which being connected to a cathode of the first diode; a second resistor, one end of which being connected to the neutral wire input end, and the other end of which being connected to the cathode of the second diode; a rectification module, which is connected to the live wire input end and the neutral wire input end; a power supply, which is configured to supply power to the AC detection circuit; a current mirror module, which is provided with an input end, a first output end and a second output end, the input end being connected to the power supply, and the value of the current outputted from the first output end of the current mirror module and the value of the current outputted from the second output end of the current mirror module having a fixed ratio; a unidirectional conduction module, which is configured to enable unidirectional conduction of the current from the first output end of the current mirror module to the cathode of the first diode; a current comparison module, which is configured to compare a current value of a second output end of the current mirror module with a reference current value and output a comparison result. The current comparison module includes: an oscillator, a timer, a current comparator and a reference current source; the oscillator is configured to generate a periodic oscillation signal as a clock signal of the timer; the current comparator is provided with a first input end, a second input end and an output end, the first input end of the current comparator being connected to the second output end of the current mirror module, the second input end of the current comparator being connected to the reference current source, and the output end of the current comparator being connected to the timer; the current comparator compares the current value of the second output end of the current mirror module with the reference current value of the reference current source, and outputs a comparison result signal; and the timer is set with a timer value, and the comparison result signal is outputted after the comparison result signal maintains for the time of the timer value. According to the present invention, the power supply state of the AC power supply is judged by detecting the resistance value between the neutral wire and live wire of the AC power supply. When there is no AC voltage between the neutral wire and the live wire of the AC power supply and the resistance value is less than a set value, then the high level is outputted, otherwise the low level is outputted. A detection threshold of the resistance value used for judging the power supply state is not affected by the fluctuation of the power supply of the detection circuit, will not change with an application environment, and has high reliability. The circuit has a simple structure, and is convenient to design and debug.

The above embodiments only illustrate the principles of the present invention and its effects, and are not intended to limit the present invention. Any person skilled in the art can modify or change the above embodiments without violating the spirit and scope of the present invention. Therefore, all equivalent modifications or changes made by those with ordinary knowledge in the art without departing from the spirit and technical ideas disclosed by the present invention should still be covered by the claims of the present invention.

What is claimed is:

1. An AC detection circuit, configured to detect a power supply state of an AC power supply for a load, wherein the AC detection circuit comprises:
   a live wire input end and a neutral wire input end;
   a first diode and a second diode with anodes connected to each other, wherein the first diode and the second diode are both Zener diodes, and a cathode of the second diode is grounded;
   a first resistor, having a first end connected to the live wire input end, and a second end connected to a cathode of the first diode;
   a second resistor, having a first end connected to the neutral wire input end, and a second end connected to the cathode of the second diode;
   a rectification module, connected to the live wire input end and the neutral wire input end;

a power supply, configured to supply power to the AC detection circuit;

a current mirror module, having an input end, a first output end and a second output end, wherein the input end of the current mirror module is connected to the power supply, and a value of the current outputted from the first output end of the current mirror module and a value of the current outputted from the second output end of the current mirror module have a fixed ratio;

a unidirectional conduction module, configured to enable unidirectional conduction of the current from the first output end of the current mirror module to the cathode of the first diode; and a current comparison module, configured to compare a current value of the second output end of the current mirror module with a reference current value and output a comparison result, wherein the current comparison module comprises: an oscillator, a timer, a current comparator and a reference current source; the oscillator is configured to generate a periodic oscillation signal as a clock signal of the timer; the current comparator is provided with a first input end, a second input end and an output end, wherein the first input end of the current comparator is connected to the second output end of the current mirror module, the second input end of the current comparator is connected to the reference current source, and the output end of the current comparator is connected to the timer; the current comparator compares the current value of the second output end of the current mirror module with the reference current value of the reference current source, and outputs a comparison result signal; and the timer is set with a timer value, and the comparison result signal is outputted after the comparison result signal maintains for the time of the timer value.

2. The AC detection circuit according to claim 1, wherein the unidirectional conduction module comprises:

an NMOS transistor, having a drain connected to the first output end of the current mirror module, and a source connected to the cathode of the first diode; and an amplifier, having a first input end, a second input end and an output end, wherein the first input end of the amplifier is connected to a reference voltage source, the second input end of the amplifier is connected to the source of the NMOS transistor, and the output end of the amplifier is connected to a gate of the NMOS transistor.

3. The AC detection circuit according to claim 2, wherein the current mirror module comprises: a first PMOS transistor and a second PMOS transistor with gates connected to each other; wherein sources of the first PMOS transistor and the second PMOS transistor are connected to the power supply, a drain of the first PMOS transistor is connected to the first output end of the current mirror module and a gate of the first PMOS transistor, and a drain of the second PMOS transistor is connected to the second output end of the current mirror module.

4. The AC detection circuit according to claim 3, wherein a ratio of a channel width-to-length ratio of the first PMOS transistor to a channel width-to-length ratio of the second PMOS transistor is 1:m.

5. The AC detection circuit according to claim 4, wherein when there is no AC voltage between the live wire input end and the neutral wire input end, and an impedance Rx of the load meets the following conditions, the timer outputs a high-level signal:

$$Rx < \frac{M \times Vref}{Iref} - R1 - R2$$

in the above formula, M is a ratio of the output current of the second output end of the current mirror module to the output current of the first output end of the current mirror module, Vref is a voltage value of the reference voltage source, Iref is a current value of the reference current source, R1 is a resistance value of the first resistor, and R2 is a resistance value of the second resistor.

6. The AC detection circuit according to claim 3, wherein reverse breakdown voltages and forward conduction voltages of the first diode and the second diode meet the following conditions:

$$V_z + V_D > Vref$$

in the above formula, $V_z$ is the reverse breakdown voltages of the first diode and the second diode, $V_D$ is the forward conduction voltages of the first diode and the second diode, and Vref is a voltage value of the reference voltage source.

7. The AC detection circuit according to claim 3, wherein the timer value set in the timer is greater than ½ of an AC cycle of the AC power supply.

8. The AC detection circuit according to claim 1, wherein the rectification module comprises:

a third diode, having a cathode connected to the live wire input end, and an anode grounded; and a fourth diode, having a cathode connected to the neutral wire input end, and an anode grounded.

9. The AC detection circuit according to claim 8, wherein reverse breakdown voltages of the third diode and the fourth diode are higher than a peak voltage of the AC power supply.

10. The AC detection circuit according to claim 1, wherein the rectification module comprises a bridge rectifier device and a second load, wherein the bridge rectifier device comprises: a fifth diode, a sixth diode, a seventh diode and an eighth diode;

wherein a first end of the second load is connected to anodes of the fifth diode and the sixth diode, and a second end of the second load is connected to cathodes of the seventh diode and the eighth diode; a cathode of the fifth diode is connected to an anode of the seventh diode and the live wire input end; and a cathode of the sixth diode is connected to an anode of the eighth diode and the neutral wire input end.

* * * * *